United States Patent
Hahm et al.

[11] Patent Number: 6,143,654
[45] Date of Patent: Nov. 7, 2000

[54] METHOD OF FORMING TUNGSTEN PATTERN FOR A SEMICONDUCTOR DEVICE

[75] Inventors: Jin-hwan Hahm, Seoul; Chang-jin Kang, Kyungki-do, both of Rep. of Korea

[73] Assignee: Samsung Electronics Co. Ltd., Suwon, Rep. of Korea

[21] Appl. No.: 09/229,337

[22] Filed: Jan. 13, 1999

[30] Foreign Application Priority Data

Jan. 13, 1998 [KR] Rep. of Korea ............... 98-698

[51] Int. Cl.[7] .................................................. H01L 21/44
[52] U.S. Cl. ............................................ 438/685; 438/685
[58] Field of Search .................................. 438/683, 688, 438/685, 656, 648, 636, 629

[56] References Cited

U.S. PATENT DOCUMENTS

| | | | |
|---|---|---|---|
| 5,693,556 | 12/1997 | Cleeves | 437/685 |
| 5,856,238 | 1/1999 | Jung | 438/688 |
| 5,882,999 | 3/1999 | Anderson et al. | 438/629 |
| 5,925,501 | 7/1999 | Zhang et al. | 438/303 |

FOREIGN PATENT DOCUMENTS 8-186120  7/1996  Japan.

*Primary Examiner*—David Nelms
*Assistant Examiner*—Dung A Le
*Attorney, Agent, or Firm*—Jones Volentine, LLC

[57] ABSTRACT

A capping film having a lower etch rate than a tungsten film is formed thereon and a photoresist layer is formed on the capping film. Preferably, the capping film is a titanium-based layer or an aluminum-based layer. After a photoresist pattern is formed by exposing and developing the photoresist film, the tungsten film is patterned by a dry etch method. During the etching of the tungsten film, the capping film reacts with the etching material to form a polymer which serves as a hard mask for the tungsten film. Preferably, the capping film also has a lower reflectivity at the exposing wavelength for the photoresist than the tungsten film, so the exposure of the photoresist may be controlled. Alternatively, or additionally, an anti-reflective film is provided between the capping film and the photoresist to further reduce the effect of the reflection of the tungsten film. Thus, patterning failures can be prevented. Such a method is particularly advantageous when the tungsten film pattern formed thereby is to be used as a bit line in a semiconductor device, particularly a pattern having a design rule of 0.34 μm or less.

21 Claims, 4 Drawing Sheets

METHOD OF FORMING TUNGSTEN PATTERN FOR A SEMICONDUCTOR DEVICE

The present application claims priority under 35 U.S.C. §119 to Korean Application No. 98-698, which is hereby incorporated by reference in its entirety for all purposes.

BACKGROUND OF THE INVENTION

1. Field of the Invention

The present invention relates to a method of forming a tungsten pattern for a semiconductor device, and more particularly, to a method of forming a tungsten pattern used as a bit line for a semiconductor device.

2. Description of the Related Art

When a bit line is formed on a semiconductor substrate in a process for forming a semiconductor device, a conductive material such as polycrystalline silicon or tungsten silicide, $WSi_x$ has been used to form the bit line. However, as a design rule is reduced to about 0.34 μm or below, a material having lower resistance is required for forming a bit line. Accordingly, a method has been proposed of forming a bit line using a metal material such as titanium nitride TiN or tungsten W. As the design constraints of a line and space pattern are reduced, it is hard to pattern a metal film such as a tungsten film to a fine pitch.

In general, as shown in FIG. 1, a photoresist pattern 40 is formed by forming a photoresist film on a tungsten film 20, exposing the photoresist film to light and developing the exposed photoresist film, in order to pattern the tungsten film 20. Here, control of the exposure dose of the photoresist film becomes difficult because of the reflection of light used during the exposing by the tungsten film 20 below the photoresist film. Thus, formation of an inorganic anti-reflective layer 30 of silicon oxynitride SiON series below the photoresist film has been proposed to lower the reflection of the tungsten film 20. The anti-reflective layer 30 attenuates light reflected from the tungsten film 20.

However, when the SiON series anti-reflective film 30 is used, it is difficult to obtain a good critical dimension (CD) of the photoresist pattern 40 when its design rule is decreased to 0.34 μm or below. Also, as the slope of the vertical profile of the photoresist pattern 40 increases, a patterning failure due to exposing and developing failures, such as a tail, can be formed on the bottom surface of the photoresist pattern 40.

When the photoresist film is excessively exposed in the exposure process to prevent these exposing and developing failures, a loss of the photoresist pattern 40 occurs. That is, when the photoresist film is formed to a thickness of approximately 0.5 μm to 0.7 μm, the photoresist pattern 40 is reduced to a thickness of about 0.2 μm to 0.3 μm after the exposure and development. Accordingly, when the photoresist pattern 40 is used as an etch mask in a process for etching the tungsten film 20, deficient selectivity makes it difficult to selectively etch the tungsten film 20.

In general, the tungsten film 20 is dry-etched using a fluorine based etch gas. When such a fluorine based etch gas is used, the etch selectivity of the photoresist pattern 40 with respect to the tungsten film 20 decreases more and more, which further thins the photoresist pattern 40. Thus, a good tungsten pattern 25 of FIG. 2 cannot be achieved. An SiON film, used as the anti-reflective layer 30, also has a low etch rate with respect to the tungsten film 20. Accordingly, the SiON film 30 receives a side wall attack as shown by reference numeral 61 of FIG. 1, by the fluorine-containing etch gas. Thus, the photoresist pattern 40 on the anti-reflective layer 30 may be lifted. Such a failure occurs even in an over etch process for controlling the profile of the formed tungsten film pattern 25, probably generating a pattern failure.

Also, in a buried contact (BC) process following formation of the tungsten film pattern 25, a spacer must be formed on the sidewall of the tungsten film pattern 25 to secure a self aligned contact (SAC) margin. Accordingly, a silicon nitride ($Si_3N_4$) film 50 must be added on the tungsten film 20 to form such a spacer. However, the silicon nitride film 50 is also damaged, or its sidewall is attacked, by the fluorine-containing gas for etching the tungsten film 20. Thus, a silicon nitride film pattern 55 cannot completely cover the upper portion of the formed tungsten film pattern 25 as shown in FIG. 2. Furthermore, since the fluorine based etch gas is also used in the BC process, the tungsten film pattern 25 is exposed to thus limit security of the margin in the subsequent BC process.

SUMMARY OF THE INVENTION

The present invention is therefore directed to a method of forming a tungsten pattern which substantially overcomes one or more of the problems due to the limitations and disadvantages of the related art.

To solve the above problems, it is an object of the present invention to provide a method of forming a tungsten film pattern for a semiconductor device, by which exposure and development failures in a photoresist patterning process are prevented by reducing the reflection of a tungsten film, and damage to the photoresist pattern, and any anti-reflective film, and attack on their sidewalls due to patterning of the tungsten film can be prevented by selectively patterning the tungsten film.

The above and other objects may be achieved by forming a tungsten film on a semiconductor substrate and forming a capping film on the tungsten film. The capping film reduces the reflection of the tungsten film and has a lower etch rate than the tungsten film. Advantageously, the capping film is formed of either titanium or titanium nitride. Then, a photoresist film is formed on the capping film. The photoresist pattern is used as etch mask to form a capping film pattern and a tungsten film pattern.

Preferably, the patterns are formed by an etch method using a fluorine-containing etch gas such as sulfur hexafluoride gas. The tungsten film pattern preferably has a line width of about 0.18 μm or less, specifically, between about 0.12 μm and 0.15 μm. The tungsten film pattern may be used as a bit line.

The method of forming a tungsten film pattern for a semiconductor device may further include forming a spacer on the sidewall of the bit line. The method may also include, after forming a capping film, forming a silicon nitride film, which is to be connected to the spacer for covering the bit line, on the capping film.

The above and other objects may also be realized by forming a tungsten film on a semiconductor substrate and forming a capping film on the tungsten film. The capping film has a high etch selectivity with respect to the tungsten film, i.e., a lower etch rate than the tungsten film. Advantageously, the capping film is formed of a material selected from the group consisting of titanium, titanium nitride and aluminum. Then, an anti-reflective film for lowering the reflection of the tungsten film is formed on the capping film. A photoresist film is formed on the antireflective film. A photoresist pattern exposing the anti-reflective film is formed on the anti-reflective film, by exposing to light and developing the photoresist film.

Thereafter, the exposed anti-reflective film, the underlying capping film, and the tungsten film are sequentially patterned using the photoresist pattern as an etch mask. The patterning is preferably performed by an etch method using a fluorine-containing etch gas such as sulfur hexafluoride gas. The tungsten film pattern preferably has a line width of about 0.18 µm or less, that is, between about 0.12 µm and 0.15 µm. The tungsten film pattern may be used as a bit line.

The method of forming a tungsten film pattern for a semiconductor device may further include forming a spacer on the sidewall of the bit line. The method may further include, after forming a capping film, forming a silicon nitride film, connected to the spacer for covering the bit line, on the capping film.

According to the present invention, exposure and development failures in the photoresist patterning process can be prevented by reducing the reflectivity of the tungsten film. Also, since the tungsten film can be selectively patterned, damage to the photoresist pattern and the anti-reflective film and attack on their sidewalls can be prevented when patterning the tungsten film.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
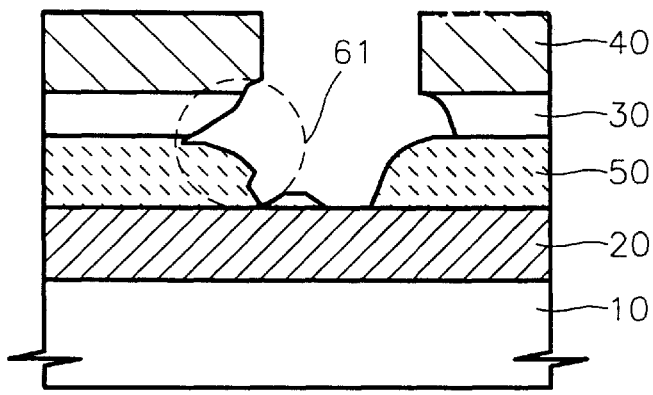
FIGS. 1 and 2 are cross-sectional views illustrating problems of a conventional method of forming a tungsten pattern.
Figure 2:
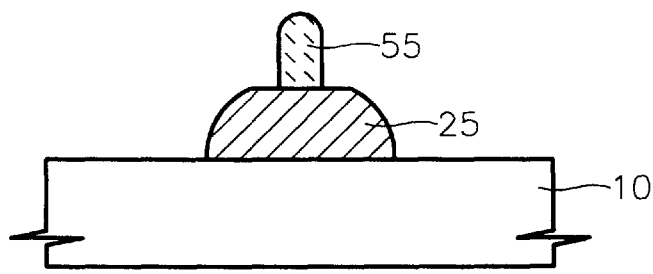

Embodiments of the present invention will now be described in detail referring to the attached drawings. However, the embodiments of the present invention can be modified in various different forms, and it must be understood that the scope of the present invention is not limited to the embodiments to be described later. The embodiments of the present invention are provided to give a more complete description of the present invention to those skilled in the art. Accordingly, in the drawings, the thicknesses of films are exaggerated for clarity, and the same reference numerals denote the same elements. When it is written that a certain film is placed "on" another film or a semiconductor substrate, the film can be placed in contact with the other film or semiconductor substrate, or a third film can interpose between the film and the other film or semiconductor substrate.

First Embodiment

A method of forming a tungsten film pattern according to a first embodiment of the present invention will be described referring to FIGS. 3 through 5.

Figure 3:
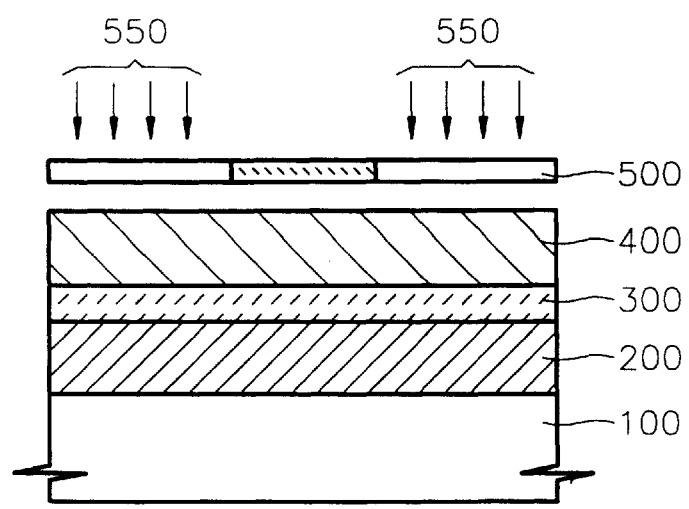
FIG. 3 is a cross-sectional view illustrating the step of exposing a photoresist film formed on a capping film.

First, a tungsten film 200 will be formed on a semiconductor substrate 100 as shown in FIG. 3. The tungsten film 200 may be used to form a bit line. A tungsten silicide film has previously been used as the bit line for a semiconductor device. However, when the design rule of the semiconductor device is reduced to 0.34 µm or less, specifically, about 0.12 to 0.15 µm, use of the tungsten film 200 is proposed to improve step coverage and electrical conductivity.

The tungsten film 200 irregularly reflects light incident on its surface. Accordingly, when a photoresist film 400 formed on the tungsten film 200 is selectively exposed using a mask 500 and a light source 550 such as g-, h- and i-line, a difficulty is encountered. In order to prevent the irregular reflection by the tungsten film 200, i.e., to reduce the reflectivity of the tungsten film 200, in accordance with the present invention, a capping film 300 is formed between the tungsten film 200 and the photoresist film 400.

The capping film 300 is formed of a material having an etch selectivity with respect to the tungsten film 200, in consideration of a subsequent process for etching the tungsten film 200. That is, the capping film 300 is formed of a material having a lower etch rate than that of the tungsten film 200, e.g., a titanium-based material. Advantageously, a titanium (Ti) film or titanium nitride (TiN) film is deposited on the tungsten film 200. Preferably, the capping film 300 is a titanium nitride (TiN) film.

Since the surface of the titanium nitride film is less rough than that of the tungsten film 200, the photoresist film 400 formed above the tungsten film 200 becomes planarized. Also, the titanium nitride film has a lower reflectivity for the light from the light source 550 than the tungsten film 200. This lower reflectivity prevents excess exposure and a standing wave phenomenon, both causes of patterning failure when the photoresist film 400 is exposed.

Figure 4:
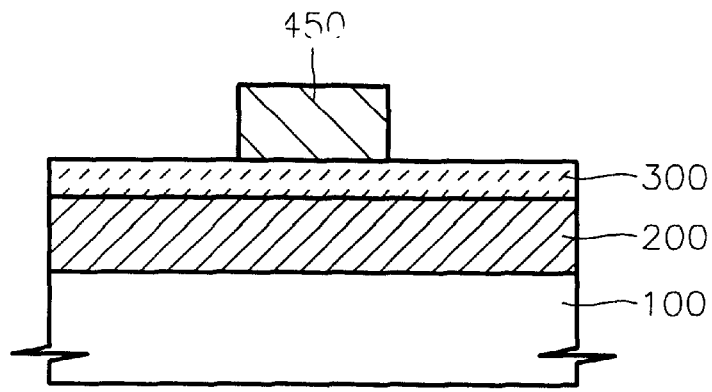
FIG. 4 is a cross-sectional view illustrating the step of developing a photoresist film to form a photoresist pattern exposing the capping film.

Referring to FIG. 4, a photoresist pattern 450 exposing the capping film 300 is formed by developing the exposed photoresist film 400. Since exposure failure is prevented by the capping film 300, the photoresist film 400 is patterned to satisfy a required design rule of 0.34 µm or less, more specifically, between 0.12 µm and 0.15 µm.

Figure 5:
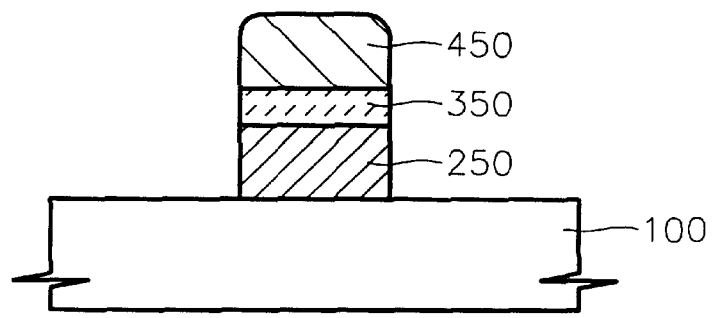
FIG. 5 is a cross-sectional view illustrating the step of patterning the exposed capping film and the underlying tungsten film using the photoresist pattern as an etch mask.

Referring to FIG. 5, the exposed capping film 300 and the tungsten film 200 are sequentially etched by a dry etch method or related etch methods. Preferably, a fluorine-based gas is used as an etch gas of the dry etch method. Thus, both the exposed capping film 300 and the tungsten film 200 are etched using a fluorine-based gas. Preferably, the fluorine-based gas is a sulfur hexafluoride ($SF_6$) gas. In general, a titanium-based material, e.g., a titanium nitride film, used as the capping film 300, has a low etch rate with respect to a fluorine-based gas. This low etch rate is due to a titanium fluoride by-product resulting from a reaction between the fluorine-based gas such as the sulfur hexafluoride ($SF_6$) gas and the titaniumbased film (e.g., a titanium nitride film).

The titanium fluoride by-product acts as a polymer for impeding etching, since it has a high steam pressure. That is, the titanium fluoride by-product has a low etch rate when using the fluorine-based gas. However, the tungsten film 200 has a high etch rate in fluorine-based gas. Therefore, the capping film pattern 350, being the result of the etching of the capping film 300, functions as a hard mask in the process for etching the tungsten film 200.

The by-product remains near the etched surfaces or sidewalls of the capping film and/or anti-reflective film for a sufficient time to protect the capping film pattern and/or a anti-reflective film pattern from being damaged during the etching ofthe underlying tungsten film.

The capping film 300 also functions as an anti-reflective film for lowering the reflectivity of the tungsten film 200, which is of concern when the photoresist film 400 is patterned. Also, when the tungsten film 200 is dry-etched using the photoresist pattern 450 as an etch mask, the capping film pattern 350 serves as a hard mask for preventing damage to the tungsten film pattern 250 due to damage to the photoresist pattern 450. Thus, patterning failures such as lifting of the photoresist pattern 450 can be prevented. The tungsten film 200 can be selectively etched, so that the tungsten film pattern 250 can have an excellent profile.

Second Embodiment

Figure 6:
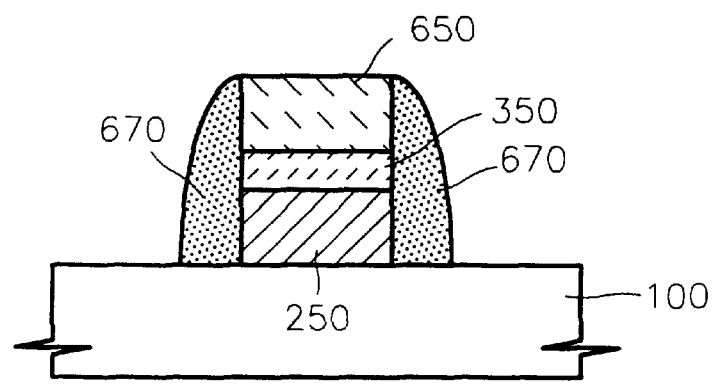
FIG. 6 is a cross-sectional view illustrating the step of forming a spacer for covering the tungsten pattern.

The second embodiment of the present invention will be described referring to FIG. 6. In the second embodiment ofthe present invention, when a BC process is performed after forming an interlayer insulating film covering the tungsten film 200, after the tungsten film pattern 200 is formed as in the first embodiment, a silicon nitride film is further formed on the capping film 300, before the step of forming the photoresist film 400. In this case, the capping film pattern 350 can also serve as a hard mask, preventing the patterning failures such as lifting of the photoresist pattern 450. The tungsten film pattern 250 having an excellent profile can be formed.

Upon formation ofthe silicon nitride pattern 650, side wall attack or other failures can be prevented by a polymer generated by the capping film 300 when etching using a fluorinebased gas. Accordingly, the silicon nitride pattern 650 can completely cover the upper surfaces of the tungsten film pattern 250 and capping film pattern 350. After the silicon nitride pattern 650, a spacer 670 covering the sidewalls of the tungsten film pattern 250 can be formed in the subsequent process. The spacer 670 helps to secure a better process margin for alignment in a contact formation process such as a subsequent BC process, etc. That is, an SAC process can be performed. In the second embodiment, the same reference numerals as those of the first embodiment denote the same elements.

Third Embodiment

A method of forming a tungsten pattern according to the third embodiment of the present invention will be described referring to FIGS. 7 through 9. In the third embodiment, a capping film 300a serves as a hard mask, but does not need to lower the reflectivity of the tungsten film 200 as in the first embodiment. Accordingly, an anti-reflective film 700 is added on the capping film 300a. In the third embodiment, the same reference numerals as those of the first and second embodiments denote the same elements.

Figure 7:
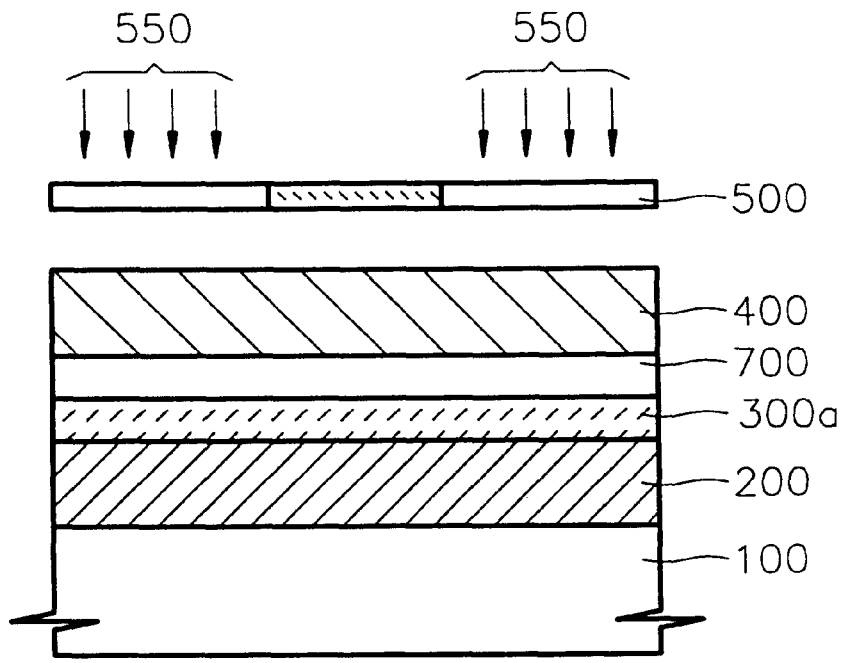
FIG. 7 is a cross-sectional view illustrating the step of exposing a photoresist film formed on the anti-reflective film.

Referring to FIG. 7, the tungsten film 200 is formed on the semiconductor substrate 100. Then, the capping film 300a is formed on the tungsten film 200. The capping film 300a is used as a hard mask in a subsequent process for etching the tungsten film 200. Thus, the capping film 300a is formed of a material having an etch selectivity with respect to the tungsten film 200, that is, having a lower etch rate than the tungsten film 200. Examples are a titanium-containing material (e.g., titanium or titanium nitride) or aluminum. In contrast with the first and second embodiments, since an anti-reflective film 700 is additionally formed in the third embodiment, a material which does not lower the reflectivity of the tungsten film 200 can be used as the capping film 300a. That is, a material having a low etch rate under the conditions for a subsequent etch process of the tungsten film 200, but does not reduce the reflectivity ofthe tungsten film 200, such as aluminum, can be used as the capping film 300a.

Then, the anti-reflective film 700 is formed on the capping film 300a. The anti-reflective film 700 is formed of a material that reduces the reflectivity of the capping film 300a. For example, the anti-reflective film 700 may be a silicon oxynitride film. The capping film 300a partially reduces the reflectivity ofthe tungsten film 200. The reflectivity of the tungsten film 200 can be reduced more by the anti-reflective film 700 on the capping film 300a. This prevents excessive exposure and standing wave phenomena, both causes of pattern failure when the photoresist film 400 is exposed to light 550 incident via the mask 500.

Figure 8:
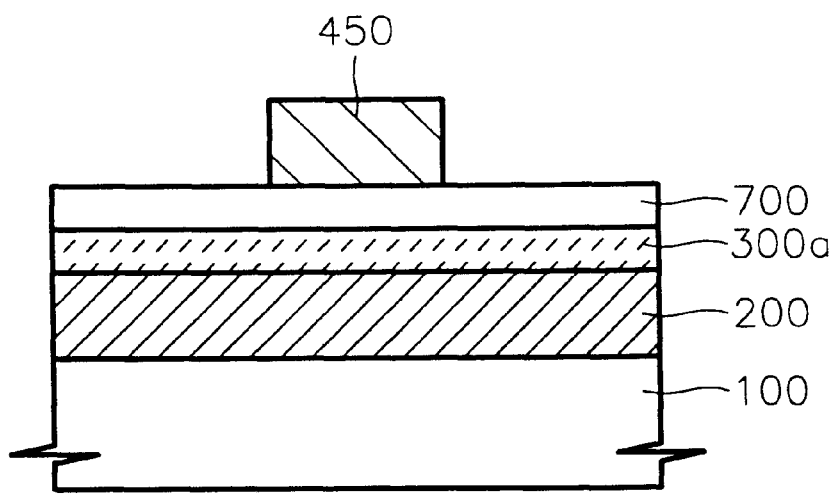
FIG. 8 is a cross-sectional view illustrating the step of developing the photoresist film to form a photoresist pattern exposing the anti-reflective film.

Referring to FIG. 8, the exposed photoresist film 400 is developed to form a photoresist pattern 450 exposing the anti-reflective film 700. Here, since the anti-reflective film 700 prevents exposure failure, a required design rule of 0.34 $\mu$m or less, more specifically, approximately between 0.15 $\mu$m and 0.12 $\mu$m, can be satisfied.

Figure 9:
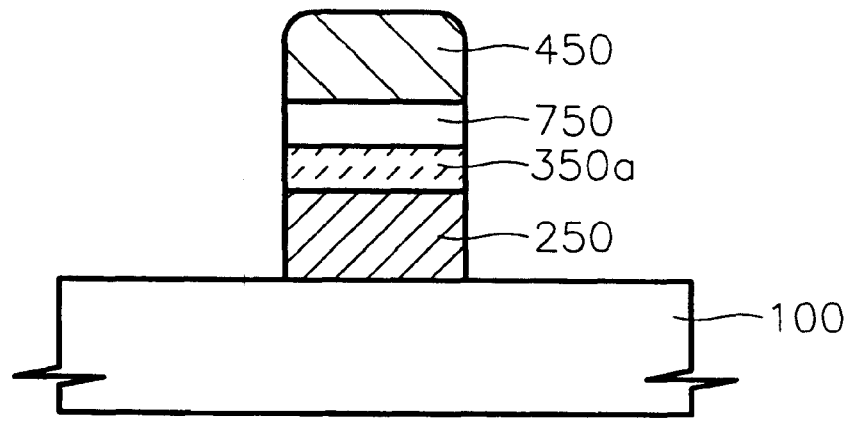
FIG. 9 is a cross-sectional view illustrating the step of patterning the exposed antireflective film, the capping film and the tungsten film using the photoresist pattern as an etch mask.

Referring to FIG. 9, the exposed anti-reflective film 700, the capping film 300a and the tungsten film 200 are sequentially etched by a dry etch method, preferably using a fluorine-containing gas. As described in the first embodiment, the titanium-based film (e.g., titanium nitride) or the aluminum film of this embodiment, used as the capping film 300a, generally has a high etch rate with respect to, e.g., a chlorine-based gas, but has a low etch rate with respect to the fluorine-based gas. The fluorine-based gas, such as sulfur hexafluoride, reacts with the titanium-based film, such as the titanium nitride film, or with the aluminum film, generating by-products such as titanium fluoride ($TiF_x$) or aluminum fluoride ($AlF_x$), respectively.

The by-products serve as a polymer for impeding etching, because of its high steam pressure. That is, either by-product has a low etch rate. However, the fluorine-based gas has a high etch rate with respect to the tungsten film 200. Accordingly, the capping film pattern 350a (the result of etching the capping film 300a), is used as a hard mask in the process for etching the tungsten film 200. The polymer prevents the sidewall attack to the anti-reflective film pattern 750 and the photoresist pattern 450. Thus, the photoresist pattern 450 and the anti-reflective film pattern 750 can be prevented from being damaged, and the patterning failure such as lifting of the photoresist pattern 450 can be prevented. Since the tungsten film 200 can be selectively etched, the formed tungsten film pattern 250 can have a good profile.

Fourth Embodiment

Figure 10:
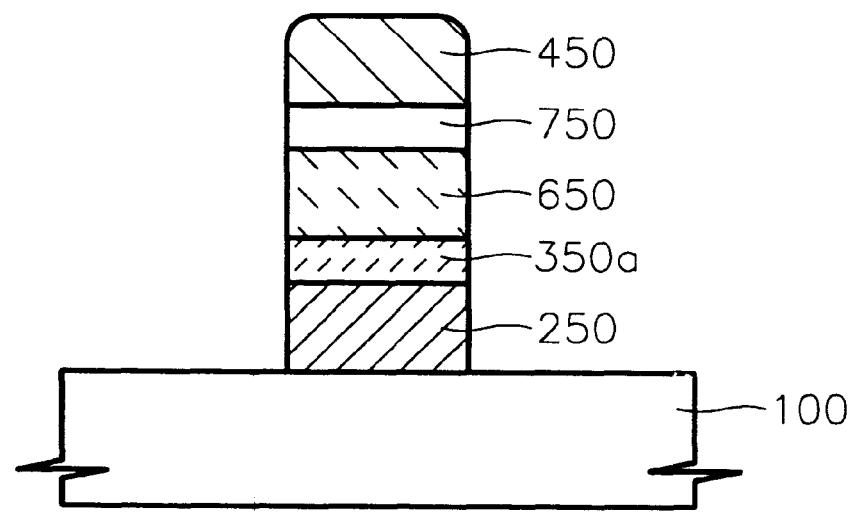
FIG. 10 is a cross-sectional view illustrating a method of forming a tungsten pattern, according to a fourth embodiment of the present invention.

The fourth embodiment of the present invention will be described referring to FIG. 10. In the fourth embodiment of the present invention, when a BC process is performed after forming an insulating interlayer film covering the tungsten film pattern 250 as in the second embodiment, a silicon nitride film is formed on the capping film 300a, before the step of forming the anti-reflective film 700. In this case, the capping film pattern 350a can also serve as a hard mask, to prevent the patterning failure such as the lifting of the photoresist pattern 450. Thus, a tungsten film pattern 250 having a satisfactory profile can be formed.

A silicon nitride pattern 650 is formed by patterning the silicon nitride film, while patterning failures such as the sidewall attack are prevented by the polymer generated when the capping film 300a is etched. Accordingly, the silicon nitride pattern 650 can entirely cover the upper surfaces of the tungsten film pattern 250 and the capping film pattern 300a. A subsequent spacer, covering the sidewalls of the tungsten film pattern 250, formed after removing the anti-reflective film pattern 750, can also cover up to the silicon nitride pattern 650. Thus, a better process margin can be secured in the BC process. That is, the SAC process can be performed. In the fourth embodiment, the same reference numerals as in the first, second and third embodiments denote the same elements.

According to the present invention described above, a capping film is formed on the tungsten film. The capping film has a lower etch rate than a tungsten film. When the capping film is formed of, e.g., of a titanium-based material such as titanium nitride, the capping film also reduces the reflectivity of the tungsten film of the exposure light for exposing a photoresist film formed on the capping film. That is, the capping film serves as an anti-reflective film.

The capping film also serves as a hard mask by generating a polymer when the tungsten film is patterned using the photoresist pattern as an etch mask. Thus, the polymer can prevent patterning failures such as damage and lifting of the photoresist pattern. The capping film pattern also serves as a hard mask in an etch process performed to control the profile of the tungsten film pattern, thus preventing the patterning failures. The tungsten film pattern, preferably having a design rule of about 0.34 µm or less, specifically, between 0.15 µm and 0.12 µm, can have a satisfactory profile, since the patterning failure is prevented.

Also, the process margin in the subsequent BC process can be better secured by further forming a silicon nitride film between the tungsten film and the photoresist film. Particularly, the silicon nitride film pattern can be connected to the spacer formed on the sidewall of the tungsten film pattern. That is, since the tungsten film pattern is entirely covered with the spacer and the silicon nitride pattern, the BC process can be performed by the SAC process, and a better process margin is secured in the SAC process.

Alternatively, the capping film may be formed of a material having a lower etch rate than the tungsten film, i.e., a titanium-containing material (e.g., titanium nitride or titanium) or aluminum, on the tungsten film. Then, an anti-reflective film, e.g., silicon oxynitride, is formed on the capping film. The anti-reflective film reduces the reflectivity of the tungsten film when a photoresist film formed on the anti-reflective film is exposed.

Also, the capping film serves as a hard mask by generating a polymer when the tungsten film is patterned using the photoresist pattern as an etch mask. The polymer prevents patterning failures such as damage and lifting of the photoresist pattern and antireflective film pattern. The capping film pattern also serves as a hard mask in the excess etch method performed to control the profile of the tungsten pattern. Therefore, the patterning failures can be prevented, and a tungsten pattern having a good profile can be formed. Furthermore, a better process margin in the BC process using the subsequent SAC process can be secured by further forming a silicon nitride film between the tungsten film and the photoresist film.

The present invention was described in detail using the above embodiments, but it is not limited to these embodiments. It is apparent that variations or improvements may be effected within the technical spirit of the present invention, by those skilled in the art.

What is claimed is:

1. A method of forming a tungsten film pattern for a semiconductor device, comprising:

forming a tungsten film on a semiconductor substrate;

forming a capping film having a lower etch rate than the tungsten film;

forming an anti-reflective film on the capping layer;

forming a photoresist pattern; and forming a capping film pattern, an anti-reflective film pattern and a tungsten film pattern using the photoresist pattern as an etch mask.

2. The method of forming a tungsten film pattern for a semiconductor device as claimed in claim 1, wherein the capping film has a lower reflectivity than the tungsten film.

3. The method of forming a tungsten film pattern for a semiconductor device as claimed in claim 2, wherein the capping film is selected from a group consisting of titanium and titanium nitride.

4. The method of forming a tungsten film pattern for a semiconductor device as claimed in claim 2, wherein the capping film pattern, the anti-reflective film pattern and the tungsten film pattern are formed using a fluorine based etch gas.

5. The method of forming a tungsten film pattern for a semiconductor device as claimed in claim 4, wherein said etching includes using sulfur hexafluoride gas.

6. The method of forming a tungsten film pattern for a semiconductor device as claimed in claim 2, wherein said patterning includes providing a tungsten film pattern having a line width of about 0.18 µm or less.

7. The method of forming a tungsten film pattern for a semiconductor device as claimed in claim 6, wherein said patterning includes providing a tungsten film pattern having a line width of between about 0.12 µm and 0.15 µm.

8. The method of forming a tungsten film pattern for a semiconductor device as claimed in claim 2, further comprising using the tungsten film pattern as a bit line.

9. The method of forming a tungsten film pattern for a semiconductor device as claimed in claim 8, further comprising forming a spacer on sidewalls of the bit line.

10. A method of forming a tungsten film pattern for a semiconductor device, comprising:

forming a tungsten film on a semiconductor substrate;

forming a capping film, on the tungsten film;

forming an anti-reflective film on the capping film;

forming a photoresist pattern, on the anti-reflective film; and using the photoresist pattern as an etch mask.

11. The method of forming a tungsten film pattern for a semiconductor device as claimed in claim 10, wherein said forming of a capping film includes forming a film from a material selected from a group consisting of titanium, titanium nitride and aluminum.

12. The method of forming a tungsten film pattern for a semiconductor device as claimed in claim 10, wherein an anti-reflective film pattern, a capping film pattern and a tungsten film pattern are formed using a fluorine based etch gas.

13. The method of forming a tungsten film pattern for a semiconductor device as claimed in claim 12, wherein the anti-reflective film pattern, the capping film pattern, and the tungsten film pattern are formed using sulfur hexafluoride gas.

14. The method of forming a tungsten film pattern for a semiconductor device as claimed in claim 10, wherein said patterning includes providing the tungsten film pattern having a line width of about 0.18 μm or less.

15. The method of forming a tungsten film pattern for a semiconductor device as claimed in claim 14, wherein said patterning includes providing the tungsten film pattern having a line width of between about 0.12 μm and 0.15 μm.

16. The method of forming a tungsten film pattern for a semiconductor device as claimed in claim 10, further comprising using the tungsten film pattern as a bit line.

17. The method of forming a tungsten film pattern for a semiconductor device as claimed in claim 16, further comprising forming a spacer on sidewalls of the bit line.

18. The method of forming a tungsten film pattern for a semiconductor device as claimed in claim 17, further comprising forming a silicon nitride film, connected to the spacer for covering the bit line, on the capping film, after the forming of a capping film.

19. The method of forming a tungsten film pattern for a semiconductor device as claimed in claim 10, wherein the capping film has a lower etch rate than the tungsten film.

20. A method of forming a tungsten film pattern of a semiconductor device, comprising:

forming a tungsten film on a semiconductor substrate;

forming a capping film on the tungsten film, the capping film having a lower etch rate than the tungsten film;

forming a photoresist pattern on the capping film; and forming a capping film pattern and a tungsten film pattern using the photoresist pattern as an etch mask, the tungsten film pattern having a line width of about 0.18 μm or less.

21. The method of forming a tungsten film pattern of a semiconductor device of claim 20, wherein the line width is between about 0.12 μm and 0.15 μm.

* * * * *